(12) United States Patent
Aebischer et al.

(10) Patent No.: US 9,379,103 B2
(45) Date of Patent: Jun. 28, 2016

(54) SEMICONDUCTOR DEVICE AND METHOD OF PREVENTING LATCH-UP IN A CHARGE PUMP CIRCUIT

(71) Applicant: Semtech Corporation, Camarillo, CA (US)

(72) Inventors: Daniel Aebischer, Marin-Epagnier (CH); Michel Chevroulet, Neuchatel (CH)

(73) Assignee: Semtech Corporation, Camarillo, CA (US)

( * ) Notice: Subject to any disclaimer, the term of this patent is extended or adjusted under 35 U.S.C. 154(b) by 131 days.

(21) Appl. No.: 14/027,043

(22) Filed: Sep. 13, 2013

(65) Prior Publication Data

US 2014/0103415 A1    Apr. 17, 2014

Related U.S. Application Data

(60) Provisional application No. 61/715,185, filed on Oct. 17, 2012.

(51) Int. Cl.
| | |
|---|---|
| *G01N 27/403* | (2006.01) |
| *H01L 27/06* | (2006.01) |
| *H01L 21/8238* | (2006.01) |
| *H01L 27/092* | (2006.01) |
| *H02M 3/07* | (2006.01) |

(52) U.S. Cl.
CPC .... *H01L 27/0629* (2013.01); *H01L 21/823892* (2013.01); *H01L 27/0921* (2013.01); *H02M 3/073* (2013.01); *H02M 2003/078* (2013.01)

(58) Field of Classification Search
None
See application file for complete search history.

(56) References Cited

U.S. PATENT DOCUMENTS

| | | |
|---|---|---|
| 5,394,365 A | 2/1995 | Tsukikawa |
| 5,734,290 A | 3/1998 | Chang et al. |
| 5,786,617 A | 7/1998 | Merrill et al. |

(Continued)

FOREIGN PATENT DOCUMENTS

EP    0836268 B1    6/2002

OTHER PUBLICATIONS

Cha, Jeongwon et al. "Analysis and Design Techniques of CMOS Charge-Pump-Based Radio-Frequency Antenna-Switch Controllers", IEEE Transactions on Circuits and Systems, vol. 56, pp. 1053-1062, May 2009.
Favrat, Pierre et al. "A High-Efficiency CMOS Voltage Doubler", IEEE Journal of Solid-State Circuits, vol. 33, pp. 410-416, Mar. 1998.

(Continued)

*Primary Examiner* — Sonya D McCall Shepard
(74) *Attorney, Agent, or Firm* — Robert D. Atkins; Patent Law Group: Atkins and Associates, P.C.

(57) ABSTRACT

A charge pump circuit includes a substrate and first well region formed in the substrate. A first transistor includes first and second conduction regions disposed in the first well region. A second well region is formed in the substrate. A third well region is formed within the second well region. A second transistor includes first and second conduction regions disposed in the third well region. The second well region and third well region are coupled to a common terminal. The common terminal receives a local potential and the first well region and second well region are commonly maintained at the local potential. The first transistor and second transistor operate within the charge pump cell. A plurality of charge pump cells can be cascaded together with an output of a first charge pump cell coupled to an input of a second charge pump cell.

25 Claims, 3 Drawing Sheets

(56) References Cited

U.S. PATENT DOCUMENTS

| | | |
|---|---|---|
| 5,828,095 A | 10/1998 | Merritt |
| 6,498,527 B2 * | 12/2002 | Matsumoto .................. 327/536 |
| 7,760,010 B2 | 7/2010 | Gebara et al. |
| 2003/0214347 A1 | 11/2003 | Nuzzarello et al. |
| 2006/0273843 A1 | 12/2006 | Daga et al. |
| 2010/0283533 A1 | 11/2010 | Li |

OTHER PUBLICATIONS

Pelliconi, Roberto et al. "Power Efficient Charge Pump in Deep Submicron Standard CMOS Technology", Proc. 27 ESSCIRC, 4 pages, 2001.

Richard, Jean-Francois et al. "High Voltage Charge Pump Using Standard CMOS Technology", The 2nd Annual IEEE Northeast Workshop on Circuits and Systems, pp. 317-320, NEWCAS 2004.

* cited by examiner

SEMICONDUCTOR DEVICE AND METHOD OF PREVENTING LATCH-UP IN A CHARGE PUMP CIRCUIT

CLAIM TO DOMESTIC PRIORITY

The present application claims the benefit of U.S. Provisional Application No. 61/715,185, filed Oct. 17, 2012, which application is incorporated herein by reference.

FIELD OF THE INVENTION

The present invention relates in general to semiconductor devices and, more particularly, to a semiconductor device and method of preventing latch-up in a charge pump circuit.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, application specific integrated circuits (ASICs), and other specific functional circuits.

Semiconductor devices perform a wide range of functions such as signal processing, high-speed calculations, transmitting and receiving electromagnetic signals, controlling electronic devices, transforming sunlight to electricity, creating visual projections for television displays, and changing voltage levels. Semiconductor devices are found in the fields of entertainment, communications, power conversion, mechanical control, networks, computers, and consumer products. Semiconductor devices are also found in military applications, aviation, automotive, industrial controllers, and office equipment.

A charge pump circuit is an example of a specific functional circuit that can be implemented on a substrate in a semiconductor die. The charge pump circuit receives an input voltage and then provides a different output voltage, either higher or lower than the input voltage. A charge pump circuit may contain a number of cells cascaded together with a voltage level shift per cell. The overall level shift of the output voltage is determined by the number of cells in the charge pump circuit, each providing a voltage level shift. FIG. 1 illustrates a conventional dual bucket charge pump cell 10 including dual cross-coupled metal oxide semiconductor (MOS) inverters receiving capacitive-coupled complementary clock signals. The input terminal 12 of charge pump cell 10 receives voltage $V_{LOW}$ while terminal 14 provides cell output voltage $V_{HIGH}$. Terminal 12 is coupled to a charge pump input voltage or terminal 14 of the preceding cell. Terminal 14 is coupled to terminal 12 of the next cell or provides the charge pump output voltage. Terminals 16 and 18 of charge pump cell 10 receive complementary clock signals CLK and nCLK of opposite phase. The clock signal CLK is coupled through capacitor 20 to the common gates of p-channel metal oxide semiconductor (PMOS) transistor 22 and n-channel metal oxide semiconductor (NMOS) transistor 24 at node 26. The clock signal nCLK is coupled through capacitor 28 to the common gates of PMOS transistor 30 and NMOS transistor 32 at node 34. The sources of transistors 22 and 30 are coupled to terminal 14. The drains of transistors 22 and 24 are coupled to node 34, and the drains of transistors 30 and 32 are coupled to node 26. The sources of transistors 24 and 32 are coupled to terminal 12 and $V_{LOW}$.

For a p-type substrate, a "high or higher voltage" generally refers to a positive voltage less than or equal to the maximum positive operating potential and greater than a "low or lower voltage", and the "low or lower voltage" generally refers to a positive voltage greater than or equal to the minimum operating potential (ground) and less than the "high or higher voltage." An n-type substrate would have opposite voltages. A voltage $V_{LOW}$, e.g., zero volts or other power supply potential, is applied to terminal 12. In cascaded charge pump cells, $V_{HIGH}$ from a previous cell is applied to terminal 12 as $V_{LOW}$. Assume CLK is a high voltage, say +3 to +5 VDC, and nCLK is a low voltage, e.g., zero volts. When charge pump cell 10 is starting up, $V_{LOW}$ may be higher than $V_{HIGH}$, which in turn is higher than or equal to Vsubstrate. The high CLK switches NMOS transistor 24 to a conductive state ($V_{GS24}$ greater than threshold $V_{TH}$ of the transistor) and renders PMOS transistor 22 non-conductive ($V_{GS22}$ not less than $V_{TH}$). Capacitor 20 stores charge from the high CLK to increase the voltage at node 26. The low nCLK switches PMOS transistor 30 to a conductive state ($V_{GS30}$ less than $V_{TH}$) and renders NMOS transistor 32 non-conductive ($V_{GS32}$ not greater than $V_{TH}$). The conductive state of transistor 30 transfers the higher voltage at node 26 directly through the source-drain conduction path of transistor 30 to terminal 14 and causes $V_{HIGH}$ to increase toward the level of the clock signal, e.g., abs(CLK−nCLK)=3 VDC. The conductive state of transistor 24 discharges node 34 and capacitor 28 toward voltage $V_{LOW}$.

In the opposite phase of the clock signal, a high nCLK renders PMOS transistor 30 non-conductive ($V_{GS30}$ not less than $V_{TH}$) and switches NMOS transistor 32 to a conductive state ($V_{GS32}$ greater than threshold $V_{TH}$). Capacitor 28 stores charge from the high nCLK to increase the voltage at node 34. The low CLK switches PMOS transistor 22 to a conductive state ($V_{GS22}$ less than $V_{TH}$) and renders NMOS transistor 24 non-conductive ($V_{GS24}$ not greater than $V_{TH}$). The conductive state of transistor 22 transfers the higher voltage at node 34 directly through the source-drain conduction path of transistor 22 to terminal 14 and causes $V_{HIGH}$ to increase toward the level of the clock signal, e.g., +3 VDC. The conductive state of transistor 32 discharges node 26 and capacitor 20 toward voltage $V_{LOW}$. The process repeats each clock cycle as the cross-coupled inverter pairs 22-24 and 30-32 alternatingly charge and discharge capacitors 20 and 28 to transfer the voltage level of the clock signal either from node 26 or from node 34 to terminal 14. The discharge of capacitors 20 and 28 through transistors 24 and 32 resets nodes 26 and 34, respectively, each clock cycle to accurately track the voltage level of the clock signal.

In steady state, $V_{HIGH}$ has a value of the clock signal, e.g., abs(CLK−nCLK)=3 VDC. Accordingly, charge pump cell 10 has increased the voltage from $V_{LOW}$=0 VDC to $V_{HIGH}$=+3 VDC. Note that charge pump cell 10 is floating so for even higher voltages, multiple stages of charge pump cell 10 can be cascaded together with terminal 14 of the previous cell coupled to terminal 12 of the next cell. For example, the first cell increases $V_{HIGH1}$=$V_{LOW1}$+voltage level of the clock signal, i.e., $V_{HIGH1}$=0+3. In the second cell, $V_{LOW2}$=$V_{HIGH1}$, and $V_{HIGH2}$=$V_{LOW2}$+voltage level of the clock signal, i.e., $V_{HIGH2}$=3+3=+6 VDC. Additional cells can be added to the charge pump circuit to achieve practically any voltage necessary for the application, e.g., $V_{HIGH}$ of 10th cell=+30 VDC.

Charge pump cell 10 is subject to internal latch-up, particularly during initial cycles of the clock signal. Latch-up inhibits normal operation of the charge pump circuit. In some cases, the internal latch-up can be traced to an activation of various vertical and lateral parasitic pnpn or npnp structures in transistors 24 and 32.

FIG. 2 shows a cross sectional view of transistors 22 and 24 from FIG. 1. Substrate 40 includes p-type semiconductor material, e.g., base silicon substrate doped with boron or gallium. A deep n-well 42 is formed in surface 44 of substrate 40 by doping with n-type material, e.g., ion implantation of phosphorus or arsenic. P-region 46 is formed in n-well 42 as the drain of transistor 22 coupled to node 34. P-region 48 is formed in n-well 42 as the source of transistor 22 coupled to terminal 14. Gate structure 50 overlies the p-channel between p-region 46 and p-region 48 and is coupled to node 26. A vertical parasitic pnp is formed between p-region 46, n-well 42, and p-substrate 40. N-region 52 is formed in n-well 42 for good ohmic contact to terminal 14 and $V_{HIGH}$ in order for transistor 22 to sustain high voltages and exhibit low drain-source resistance in the conductive state (RDSON). In a similar manner, n-well 56 is formed in surface 44 of substrate 40 by doping with n-type material. N-region 58 is formed in n-well 56 for good ohmic contact to terminal 60 operating at $V_{SS}$, e.g., ground potential. N-well 56 coupled to $V_{SS}$ represents other devices in the vicinity of charge pump cell 10. A lateral parasitic npn is formed between n-well 42, p-substrate 40, and n-well 56.

A deep n-well 64 is formed in surface 44 of substrate 40 by doping with n-type material, e.g., ion implantation of phosphorus or arsenic. N-well 64 is typically floating. A local p-well 66 is formed within n-well 64 by doping with p-type material, e.g., ion implantation of boron or gallium. N-region 68 is formed in p-well 66 as the drain of transistor 24 coupled to node 34. N-region 70 is formed in p-well 66 as the source of transistor 24 coupled to terminal 12 and $V_{LOW}$. Gate structure 72 overlies the n-channel between n-region 68 and n-region 70 and is coupled to node 26. P-region 74 is formed in p-well 66 for good ohmic contact to terminal 12 and $V_{LOW}$ in order for transistor 24 to sustain high voltages and exhibit a low impedance RDSON. A lateral parasitic npn is formed between n-well 56, p-substrate 40, and n-well 64. A vertical parasitic npn 76 is formed between n-region 68, p-well 66, and n-well 64. A vertical parasitic pnp 78 is formed between p-well 66, n-well 64, and p-substrate 40.

One of the potential causes of internal latch-up is the combination of parasitic pnp and npn structures and floating regions within the device, e.g., parasitic npn 76, parasitic pnp 78, and floating n-well 64. At start-up, there are no high voltages within charge pump cell 10, although $V_{LOW}$ may be higher than $V_{HIGH}$, and $V_{HIGH}$ is higher or equal to Vsubstrate, which is a factor that increases the occurrence of latch-up. Recall that n-well 42 is coupled to local $V_{HIGH}$ and p-well 66 is coupled to local $V_{LOW}$ with respect to charge pump cell 10 with n-well 64 floating. The initial low value of $V_{HIGH}$ creates a possibility for internal latch-up of the charge pump cell by forward biasing of one or more parasitic pnp and npn structures. Charge pump cell 10 receives voltages from CLK and nCLK through capacitors 20 and 28. CLK and nCLK cause charges to be injected into p-well 66, n-well 64, and substrate 40, which can forward bias and activate parasitic npn 76 and parasitic pnp 78, or other parasitic npn and pnp structures. The combination of two or more parasitic pnp or npn structures activated by accumulation of the injected charges latches the conductive state of the parasitic pnp and npn structures like 76-78 and shorts n-region 68 to n-well 64 or p-well 66 to substrate 40. Alternatively, latch-up can be triggered by the parasitic pnp or npn structures and resistivity of substrate 40. The injection of carriers from the clock signal coupling through capacitors 20 and 28, substrate bounce, or other spurious voltages activates two or more parasitic pnp or npn structures in a positive feedback loop to latch a parasitic pnpn or npnp combination. Once turned on, a large current flows through the parasitic pnpn and npnp in a self-maintained manner. The internal latch-up is particularly sensitive to high power supply voltages and high temperature. An internal latched condition for charge pump cell 10 inhibits normal operation and can increase power consumption. The power drain is problematic in portable battery applications and can potentially damage the circuit by excessive power dissipation.

SUMMARY OF THE INVENTION

A need exists to reduce occurrences of internal latch-up in a charge pump cell or other electronic circuit including an MOS transistor formed in first well of a first conductivity type that is formed in a second well of a second conductivity type. The first well and second well receive a local potential from a common terminal. Accordingly, in one embodiment, the present invention is a charge pump circuit comprising a substrate and first well region formed in the substrate. A first transistor includes first and second conduction regions disposed in the first well region. A second well region is formed in the substrate. A third well region is formed within the second well region. A second transistor includes first and second conduction regions disposed in the third well region. The second well region and third well region are coupled to a common terminal to receive a local potential.

In another embodiment, the present invention is a semiconductor device comprising a substrate and first well region formed in the substrate. A second well region is formed within the first well region. A first transistor is formed in the second well region. The first well region and second well region are coupled to a common terminal to receive a first local potential.

In another embodiment, the present invention is a method of making a semiconductor device comprising the steps of providing a substrate, forming a first well region in the substrate, and forming a second well region within the first well region. The first well region and second well region are coupled to a common terminal.

In another embodiment, the present invention is a method of making a semiconductor device comprising the steps of providing a substrate, forming a first well region in the substrate, and forming a first transistor in the first well region. The first well region receives a local potential.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
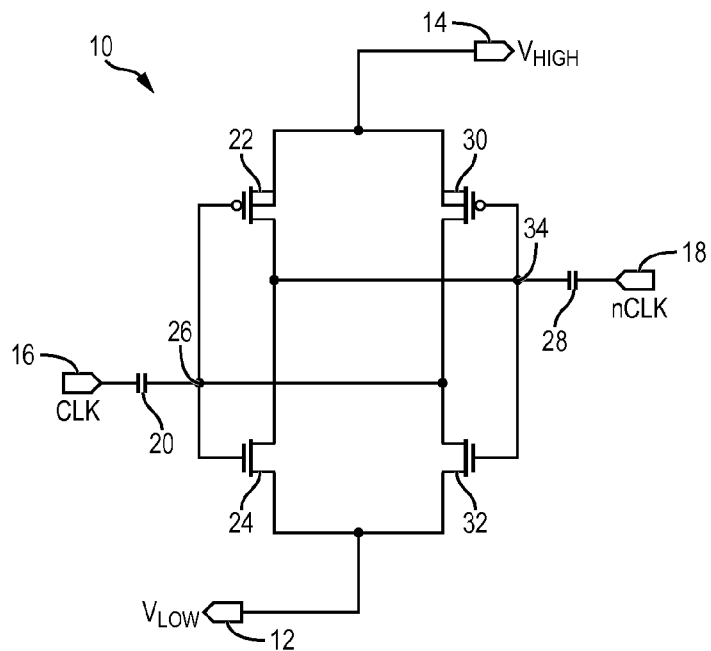
FIG. 1 illustrates a conventional charge pump cell with dual cross-coupled MOS inverters receiving capacitive-coupled complementary clock signals.
Figure 2:
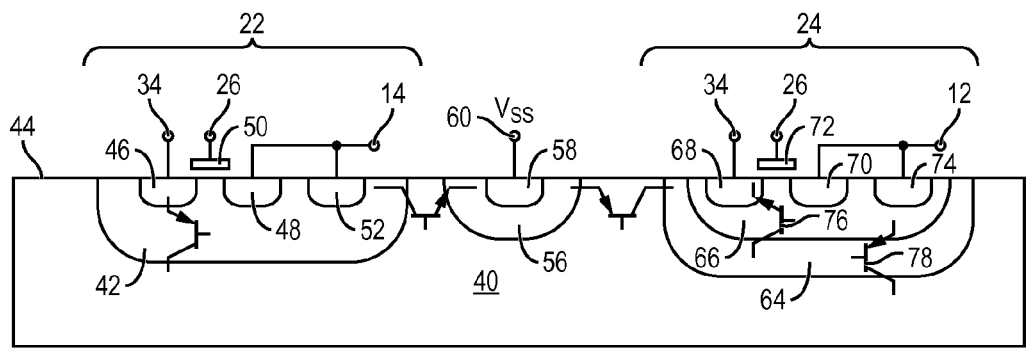
FIG. 2 illustrates a cross-sectional view of a PMOS transistor and NMOS transistor in the charge pump cell of FIG. 1 disposed in part in a floating n-well.
Figure 3:
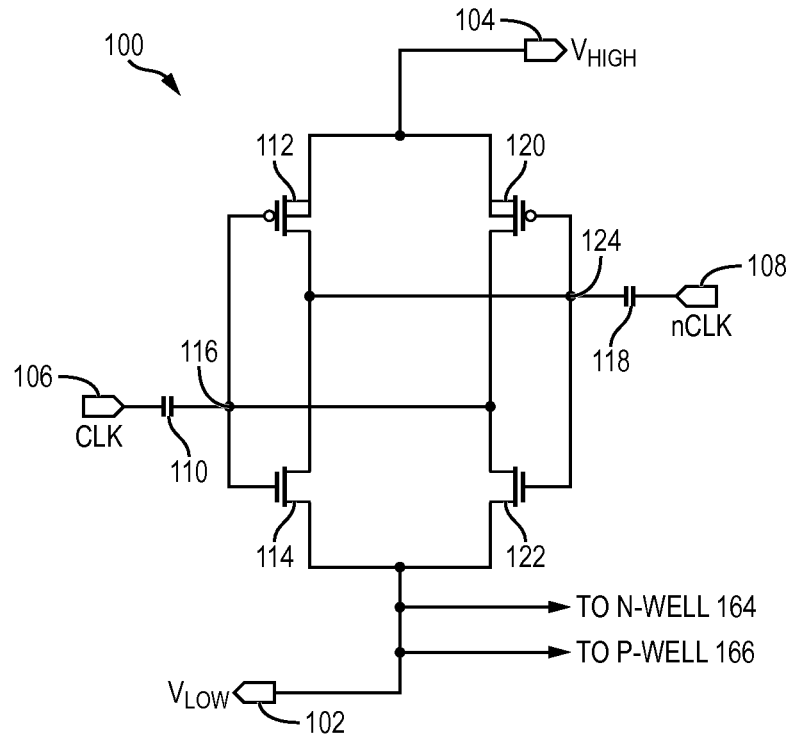
FIG. 3 illustrates a charge pump cell with dual cross-coupled MOS inverters with the n-well containing the NMOS transistors coupled to a local potential.

FIG. 3 illustrates a dual bucket charge pump cell 100 that can be implemented on a substrate in a semiconductor die. The charge pump circuit receives an input voltage and then provides a different output voltage, either higher or lower than the input voltage. Charge pump cell 100 includes dual cross-coupled MOS inverters receiving capacitive-coupled complementary clock signals of opposite phase. The input terminal 102 of charge pump cell 100 receives voltage $V_{LOW}$ while terminal 104 provides cell output voltage $V_{HIGH}$. Terminals 106 and 108 of charge pump cell 100 receive complementary clock signals CLK and nCLK. The clock signal CLK is coupled through capacitor 110 to the common gates of PMOS transistor 112 and NMOS transistor 114 at node 116. The clock signal nCLK is coupled through capacitor 118 to the common gates of PMOS transistor 120 and NMOS transistor 122 at node 124. The sources of transistors 112 and 120 are coupled to terminal 104. The drains of transistors 112 and 114 are coupled to node 124, and the drains of transistors 120 and 122 are coupled to node 116. The sources of transistors 114 and 122 are coupled to terminal 102 and $V_{LOW}$.

For a p-type substrate, a "high or higher voltage" generally refers to a positive voltage less than or equal to the maximum positive operating potential and greater than a "low or lower voltage", and the "low or lower voltage" generally refers to a positive voltage greater than or equal to the minimum operating potential (ground) and less than the "high or higher voltage." A voltage $V_{LOW}$, e.g., zero volts or other power supply potential, is applied to terminal 102. In cascaded charge pump cells, $V_{HIGH}$ from a previous cell is applied to terminal 102 as $V_{LOW}$. Assume CLK is a high voltage, say +3 to +5 VDC, and nCLK is a low voltage, e.g., zero volts. The high CLK switches NMOS transistor 114 to a conductive state ($V_{GS114}$ greater than threshold $V_{TH}$ of the transistor) and renders PMOS transistor 112 non-conductive ($V_{GS112}$ not less than $V_{TH}$). Capacitor 110 stores charge from the high CLK to increase the voltage at node 116. The low nCLK switches PMOS transistor 120 to a conductive state ($V_{GS120}$ less than $V_{TH}$) and renders NMOS transistor 122 non-conductive ($V_{GS122}$ not greater than $V_{TH}$). The conductive state of transistor 120 transfers the higher voltage at node 116 directly through the source-drain conduction path of transistor 120 to terminal 104 and causes $V_{HIGH}$ to increase toward the level of the clock signal, e.g., abs(CLK−nCLK)=3 VDC. The conductive state of transistor 114 discharges node 124 and capacitor 118 toward voltage $V_{LOW}$.

In the opposite phase of the clock signal, a high nCLK renders PMOS transistor 120 non-conductive ($V_{GS120}$ not less than $V_{TH}$) and switches NMOS transistor 122 to a conductive state ($V_{GS122}$ greater than threshold $V_{TH}$). Capacitor 118 stores charge from the high nCLK to increase the voltage at node 124. The low CLK switches PMOS transistor 112 to a conductive state ($V_{GS112}$ less than $V_{TH}$) and renders NMOS transistor 114 non-conductive ($V_{GS114}$ not greater than $V_{TH}$). The conductive state of transistor 112 transfers the higher voltage at node 124 directly through the source-drain conduction path of transistor 112 to terminal 104 and causes $V_{HIGH}$ to increase toward the level of the clock signal, e.g., +3 VDC. The conductive state of transistor 122 discharges node 116 and capacitor 110 toward voltage $V_{LOW}$. The process repeats each clock cycle as the cross-coupled inverter pairs 112-114 and 120-122 alternatingly charge and discharge capacitors 110 and 118 to transfer the voltage level of the clock signal either from node 116 or from node 124 to terminal 104. The discharge of capacitors 110 and 118 through transistors 114 and 122 resets nodes 116 and 124, respectively, each clock cycle to accurately track the voltage level of the clock signal.

Figure 4:
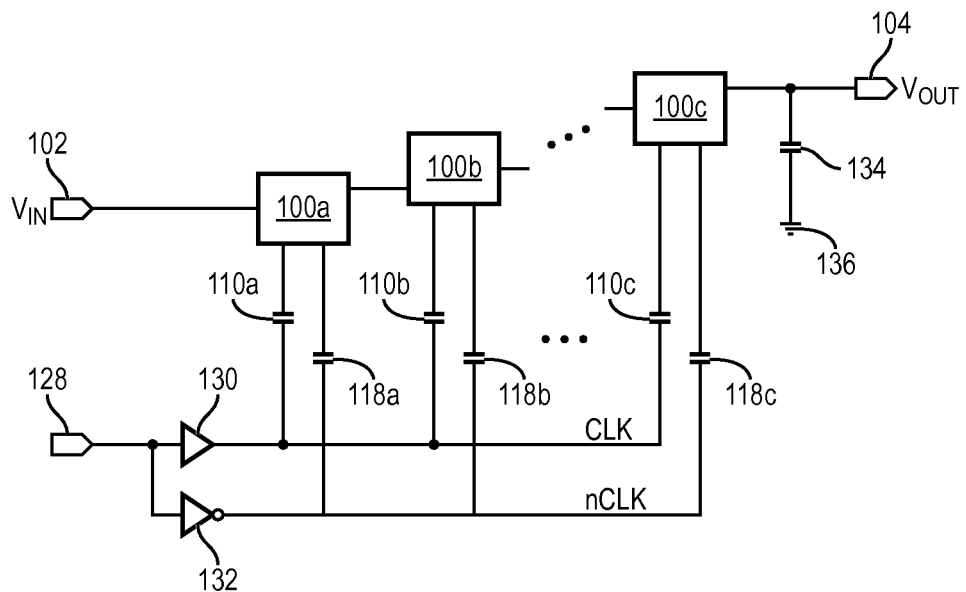
FIG. 4 illustrates a plurality of cascaded charge pump cells.

In steady state, the local potential $V_{HIGH}$ has a value of the clock signal, e.g., abs(CLK−nCLK)=3 VDC. Accordingly, charge pump cell 100 has increased the voltage from $V_{LOW}$=0 VDC to $V_{HIGH}$=+3 VDC. The charge pump circuit may contain a number of cells cascaded together with a voltage level shift per cell, as shown in FIG. 4. The $V_{HIGH}$ of one cell is coupled to $V_{LOW}$ of the next cell. For example, terminal 102 of charge pump cell 100a receives a charge pump input voltage $V_{IN}$=0 VDC. Terminal 104 of charge pump cell 100a is coupled to terminal 102 of charge pump cell 100b. Terminal 104 of charge pump cell 100b is coupled to terminal 102 of charge pump cell 100c, or the next cell in the chain. Terminal 104 of charge pump cell 100c provides the charge pump output voltage $V_{OUT}$. A primary clock signal at terminal 128 is buffered by amplifier 130 and inverter 132 to provide complementary CLK and nCLK to charge pump cells 100a-100c. The CLK and nCLK are coupled through capacitors 110a and 118a to charge pump cell 110a. The CLK and nCLK are coupled through capacitors 110b and 118b to charge pump cell 110b. The CLK and nCLK are coupled through capacitors 110c and 118c to charge pump cell 110c. Capacitor 134 is coupled between terminal 104 of charge pump cell 100c and terminal 136 operating at ground potential to provide filtering of the charge pump output voltage $V_{OUT}$.

Charge pump cell 100a increases $V_{HIGH100a}=V_{IN}$+voltage level of the clock signal, i.e., $V_{HIGH100a}$=0+3. With $V_{HIGH}$ of one cell coupled to $V_{LOW}$ of the next cell, $V_{LOW100b}=V_{HIGH100a}$, and $V_{HIGH100b}=V_{LOW100b}$+voltage level of the clock signal, i.e., $V_{HIGH100b}$=3+3=+6 VDC in charge pump cell 100b. Additional cells, e.g., charge pump cell 100c, can be added to the charge pump circuit to achieve practically any voltage necessary for the application. The overall level shift of the output voltage is determined by the number of cells in the charge pump circuit, each providing a voltage level shift. In one embodiment, $V_{OUT}$ can reach +90 VDC for control of mechanical devices.

Figure 5:
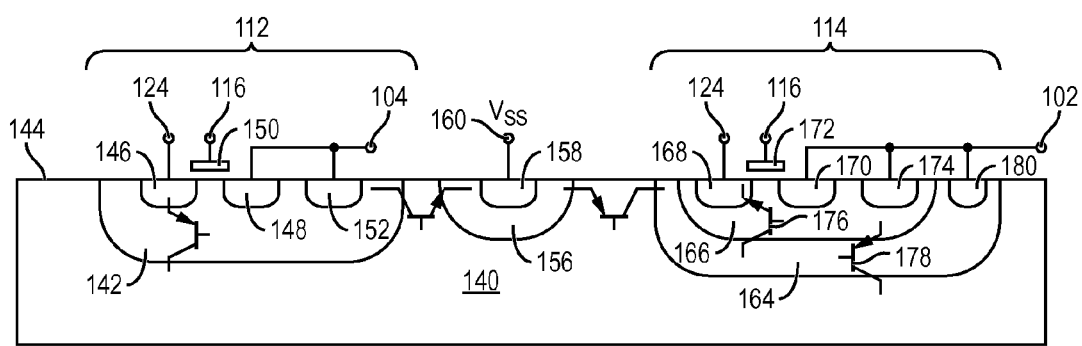
FIG. 5 illustrates a cross-sectional view of a PMOS transistor and NMOS transistor in the charge pump cell with the n-well coupled to a local potential.

FIG. 5 shows a cross sectional view of transistors 112 and 114 from FIG. 3. Substrate 140 includes p-type semiconductor material, e.g., base silicon substrate doped with boron or gallium. Although the semiconductor structure is described for a p-type substrate, an n-type substrate would have a similar structure with opposite type of semiconductor material for the substrate and semiconductor regions and opposite voltages. A deep n-well 142 is formed in surface 144 of substrate 140 by doping with n-type material, e.g., ion implantation of phosphorus or arsenic. P-region 146 is formed in n-well 142 as the drain of transistor 112 coupled to node 124. P-region 148 is formed in n-well 142 as the source of transistor 112 coupled to terminal 104. Gate structure 150 overlies the p-channel between p-region 146 and p-region 148 and is coupled to node 116. A vertical parasitic pnp is formed between p-region 146, n-well 142, and p-substrate 140. N-region 152 is formed in n-well 142 for good ohmic contact to terminal 104 and local potential $V_{HIGH}$ in order for transistor 112 to sustain high voltages and exhibit a low impedance RDSON. In a similar manner, n-well 156 is formed in surface 144 of substrate 140 by doping with n-type material. N-region 158 is formed in n-well 156 for good ohmic contact to terminal 160 operating at $V_{SS}$, e.g., ground potential. N-well 156 coupled to $V_{SS}$ represents other devices in the vicinity of charge pump cell 100. A lateral parasitic npn is formed between n-well 142, p-substrate 140, and n-well 156.

A deep n-well 164 is formed in surface 144 of substrate 140 by doping with n-type material, e.g., ion implantation of phosphorus or arsenic. A local p-well 166 is formed within n-well 164 by doping with p-type material, e.g., ion implantation of boron or gallium. N-region 168 is formed in p-well 166 as the drain of transistor 114 coupled to node 124. N-region 170 is formed in p-well 166 as the source of transistor 114 coupled to terminal 102 and $V_{LOW}$. Gate structure 172 overlies the n-channel between n-region 168 and n-region 170 and is coupled to node 116. P-region 174 is formed in p-well 166 for good ohmic contact to terminal 102 and $V_{LOW}$ in order for transistor 114 to sustain high voltages and exhibit a low impedance RDSON. A lateral parasitic npn is formed between n-well 156, p-substrate 140, and n-well 164. A vertical parasitic npn 176 is formed between n-region 168, p-well 166, and n-well 164. A vertical parasitic pnp 178 is formed between p-well 166, n-well 164, and p-substrate 140.

To resolve internal latch-up of charge pump cell 100, particularly during initial cycles of the clock signal, n-well 164 is coupled to a local potential for the cell, i.e., terminal 102 and $V_{LOW}$, as shown in FIGS. 3 and 5. More specifically, n-region 180 is formed in n-well 164 for good ohmic contact, and terminal 102 and $V_{LOW}$ is coupled to n-region 180 and n-well 164. Note that p-well 166 is also coupled to terminal 102 and $V_{LOW}$. Accordingly, the p-n (base and emitter) of vertical parasitic transistor 178 are shorted together by the common coupling to terminal 102 and $V_{LOW}$, which disables operation of the parasitic transistor. The parasitic pnp structure 178 cannot become forward biased by charges injected from CLK and nCLK into p-well 166, n-well 164, and substrate 140 because n-well 164 and p-well 166 are both coupled to common terminal 102 and $V_{LOW}$, which imposes a common local minimum potential to n-well 164 and p-well 166 (base-emitter junction potential of parasitic pnp structure 178 maintained at zero). Since parasitic pnp 178 or other parasitic pnp or npn structures in n-well 164 do not turn on due to common local potential at n-well 164 and p-well 166, internal latch-up is not triggered by the injection of carriers from the clock signal coupling through capacitors 110 and 118, substrate bounce, or other spurious voltages.

Transistors 120 and 122 have a similar construction and arrangement as transistors 112 and 114 with the n-well and p-well of transistor 122 commonly coupled to terminal 102 and $V_{LOW}$. A key feature is that n-well 164 and p-well 166 (regions of opposite conductivity type) are shorted to $V_{LOW}$ to prevent latch-up of charge pump cell 100. Accordingly, the p-n (base and emitter) of vertical parasitic transistor like 178 for transistor 122 are shorted together by the common coupling to terminal 102 and $V_{LOW}$, which disables operation of the parasitic transistor. The parasitic pnp structure cannot become forward biased by charges injected from CLK and nCLK into the p-well, n-well, and substrate because the n-well and p-well for transistor 122 are both coupled to terminal 102 and $V_{LOW}$, which imposes a common local potential to the n-well and p-well. Since the parasitic pnp or npn structures in the n-well do not turn on due to common local potential at the n-well and p-well of transistor 122, internal latch-up is not triggered by the injection of carriers from the clock signal coupling through capacitors 110 and 118, substrate bounce, or other spurious voltages.

In the case of cascaded charge pump cells, as shown in FIG. 4, the well associated with $V_{HIGH}$ in one cell operates at the same potential as the well associated with $V_{LOW}$ of the next cell. In one embodiment, transistors 112, 114, 120, and 122 are each formed in a separate well region. Alternatively, transistors can be merged into a well region having a common potential. For example, transistors 112 and 120 can be merged into the same physical n-well 142 within a cell, and transistors 114 and 122 can be merged into the same physical n-well 164/p-well 166 within the same cell. In yet another embodiment, transistors 112 and 120 associated with one cell can be merged into the same physical well as transistors 114 and 122 associated with an adjacent cell due to the common potential, i.e., $V_{HIGH}$ of the one cell connected to $V_{LOW}$ of the adjacent cell. That is, n-well 142 of cell 100a can be the same physical region as n-well 164 of cell 100b. The merging of wells within a cell or between cells provides for a higher density layout.

The semiconductor structure described above, including a substrate and first well region (e.g., n-well) formed in a substrate and second well region (e.g., p-well) formed in the first well region substrate with the first and second well regions coupled to a common terminal to receive a local potential, is applicable to other types of electronic circuits. A key feature is to maintain the p-n (base and emitter) of one or more parasitic transistors shorted together by common coupling to a local minimum potential to disable operation of the parasitic transistors. That is, n-well 164 and p-well 166 (regions of opposite conductivity type) are shorted to $V_{LOW}$ to prevent latch-up of charge pump cell 100. The parasitic pnp structure cannot become forward biased due to charges injected into the p-well, n-well, and substrate. Since the parasitic pnp or npn structures in the n-well do not turn on, latch-up is not triggered by the injection of carriers from charge injection, substrate bounce, or other spurious voltages.

While one or more embodiments of the present invention have been illustrated in detail, the skilled artisan will appreciate that modifications and adaptations to those embodiments may be made without departing from the scope of the present invention as set forth in the following claims.

What is claimed:

1. A charge pump circuit, comprising:
   a substrate;
   a first well region formed in the substrate;
   a first transistor including first and second conduction regions disposed in the first well region;
   a second well region formed in the substrate to include a third conduction region of the second well region coupled to a voltage input of the charge pump circuit, the second well region and third conduction region both doped to a first conductivity type;
   a third well region formed within the second well region, the third well region doped to a second conductivity type opposite the first conductivity type;
   a second transistor including a fourth conduction region and fifth conduction region disposed in the third well region; and
   a sixth conduction region disposed in the third well region and coupled to the voltage input of the charge pump circuit, wherein the second well region and third well region are shorted together by a common coupling to the voltage input of the charge pump circuit via the third conduction region and sixth conduction region, respectively.

2. The charge pump circuit of claim 1, further including a first capacitor including a first terminal coupled for receiving a first clock signal and a second terminal coupled to a control terminal of the first transistor and a control terminal of the second transistor at a first node.

3. The charge pump circuit of claim 2, wherein the fourth conduction region of the second transistor is coupled to the voltage input, and the fifth conduction region of the second transistor is coupled to the first conduction region of the first transistor, and the second conduction region of the first transistor is coupled to an output terminal of the charge pump circuit.

4. The charge pump circuit of claim 3, further including:
a fourth well region formed in the substrate;
a third transistor including a seventh conduction region and eighth conduction region disposed in the fourth well region;
a fifth well region formed in the substrate;
a sixth well region formed within the fifth well region; and
a fourth transistor including a ninth conduction region and tenth conduction region disposed in the sixth well region, wherein the fifth well region and sixth well region are coupled to the voltage input.

5. The charge pump circuit of claim 4, further including a second capacitor including a first terminal coupled for receiving a second clock signal of opposite phase with respect to the first clock signal and a second terminal coupled to a control terminal of the third transistor and a control terminal of the fourth transistor and to the first conduction region of the first transistor at a second node, wherein the ninth conduction region of the fourth transistor is coupled to the voltage input, and the tenth conduction region of the fourth transistor is coupled to the seventh conduction region of the third transistor and to the first node, and the eighth conduction region of the third transistor is coupled to the output terminal of the charge pump circuit.

6. The charge pump circuit of claim 1, further including a plurality of charge pump cells cascaded together with an output of a first charge pump cell coupled to an input of a second charge pump cell.

7. A semiconductor device, comprising:
a substrate;
a first well region formed in the substrate;
a second well region formed within the first well region;
a first transistor formed in the second well region, wherein the first well region and second well region are directly coupled to a common terminal to receive a first local potential;
a third well region formed in the substrate; and
a second transistor formed in the third well region.

8. The semiconductor device of claim 7, wherein the third well region is coupled to receive a second local potential.

9. The semiconductor device of claim 7, further including:
a fourth well region formed in the substrate;
a fifth well region formed within the fourth well region; and
a third transistor formed in the fifth well region, wherein the fourth well region and fifth well region are coupled to the common terminal to receive the first local potential.

10. The semiconductor device of claim 9, further including:
a sixth well region formed in the substrate; and
a fourth transistor formed in the sixth well region.

11. The semiconductor device of claim 7, further including a first charge pump cell, wherein the first transistor and second transistor operate within the first charge pump cell.

12. The semiconductor device of claim 11, further including a plurality of charge pump cells cascaded together with an output of the first charge pump cell coupled to an input of a second charge pump cell.

13. A method of making a semiconductor device, comprising:
providing a substrate;
forming a first well region in the substrate;
forming a second well region within the first well region;
coupling the first well region and second well region to a voltage input terminal of the semiconductor device to impose a similar voltage potential to the first well region and second well region
forming a first transistor in the second well region;
forming a third well region in the substrate; and
forming a second transistor in the third well region.

14. The method of claim 13, further including:
forming a fourth well region in the substrate;
forming a fifth well region within the fourth well region;
forming a third transistor in the fifth well region, wherein the fourth well region and fifth well region are coupled to the voltage input;
forming a sixth well region in the substrate; and
forming a fourth transistor in the sixth well region.

15. The method of claim 13, wherein the first transistor and second transistor operate within a first charge pump cell.

16. The method of claim 15, further including cascading a plurality of charge pump cells together with an output of the first charge pump cell coupled to an input of a second charge pump cell.

17. A method of making a semiconductor device, comprising:
providing a substrate;
forming a first well region in the substrate;
forming a second well region within the first well region;
forming a first transistor in the second well region;
coupling the first well region and second well region to a common local potential;
forming a third well region in the substrate; and
forming a second transistor in the third well region.

18. The method of claim 17, further including:
forming a fourth well region in the substrate;
forming a third transistor in the fourth well region;
forming a fifth well region in the substrate;
forming a sixth well region within the fifth well region; and
forming a fourth transistor in the sixth well region, wherein the fifth well region and sixth well region are coupled to the common local potential.

19. The method of claim 17, wherein the first transistor and second transistor operate within a charge pump cell.

20. The method of claim 17, further including cascading a plurality of charge pump cells together with an output of a first charge pump cell coupled to an input of a second charge pump cell.

21. The semiconductor device of claim 11, further including coupling the third well directly to a source terminal of the second transistor and a voltage output of the first charge pump cell.

22. The semiconductor device of claim 21, further including a second charge pump cell comprising a voltage input coupled to the voltage output of the first charge pump cell.

23. The method of claim 15, further including coupling the third well region to a source terminal of the second transistor and an output of the first charge pump cell.

24. The method of claim 23, further including coupling the output of the first charge pump cell to an input of a second charge pump cell.

25. The method of claim 17, further including coupling the third well region to a source terminal of the second transistor.

* * * * *